United States Patent
Zong et al.

(10) Patent No.: US 11,323,017 B2
(45) Date of Patent: May 3, 2022

(54) ADAPTIVE GATE REGULATION FOR A SYNCHRONOUS RECTIFIER FLYBACK CONVERTER

(71) Applicant: DIALOG SEMICONDUCTOR INC., Campbell, CA (US)

(72) Inventors: Qingqing Zong, Campbell, CA (US); Yimin Chen, Campbell, CA (US); Mengfei Liu, Campbell, CA (US); Pengju Kong, Campbell, CA (US)

(73) Assignee: Dialog Semiconductor Inc., Campbell, CA (US)

( * ) Notice: Subject to any disclaimer, the term of this patent is extended or adjusted under 35 U.S.C. 154(b) by 130 days.

(21) Appl. No.: 16/888,466

(22) Filed: May 29, 2020

(65) Prior Publication Data

US 2021/0376709 A1      Dec. 2, 2021

(51) Int. Cl.
| | |
|---|---|
| *H02M 1/08* | (2006.01) |
| *H03K 5/24* | (2006.01) |
| *H02M 3/335* | (2006.01) |
| *H03K 5/00* | (2006.01) |

(52) U.S. Cl.
CPC ......... *H02M 1/08* (2013.01); *H02M 3/33592* (2013.01); *H03K 5/24* (2013.01); *H03K 2005/00013* (2013.01)

(58) Field of Classification Search
CPC ...... H02M 1/08; H02M 3/33592; H03K 5/24; H03K 2005/00013
See application file for complete search history.

(56) References Cited

U.S. PATENT DOCUMENTS

| | | | | |
|---|---|---|---|---|
| 7,688,602 | B2* | 3/2010 | Hu | H02M 1/38 |
| | | | | 363/21.14 |
| 9,118,255 | B2* | 8/2015 | Lin | H02M 3/33592 |
| 10,033,285 | B1* | 7/2018 | Zhang | H02M 1/32 |
| 10,560,012 | B1* | 2/2020 | Yang | H02M 3/33592 |
| 10,615,700 | B1* | 4/2020 | Moon | H02M 1/38 |
| 10,658,917 | B2* | 5/2020 | Massimiani | H02M 1/08 |
| 2015/0124495 | A1* | 5/2015 | Kong | H02M 3/33523 |
| | | | | 363/21.14 |
| 2018/0062530 | A1* | 3/2018 | Kong | H02M 1/08 |

* cited by examiner

*Primary Examiner* — Kyle J Moody
(74) *Attorney, Agent, or Firm* — Haynes and Boone, LLP

(57) ABSTRACT

A flyback converter is provided that dynamically adjusts a drain threshold voltage for a current cycle of a synchronous rectifier switch transistor based upon operating conditions in a previous cycle of the synchronous rectifier switch transistor. A differential amplifier drives a gate voltage of the synchronous rectifier switch transistor during an on-time of the current cycle so that a drain voltage of the synchronous rectifier switch transistor equals the drain threshold voltage during a regulated portion of the current cycle.

19 Claims, 7 Drawing Sheets

ADAPTIVE GATE REGULATION FOR A SYNCHRONOUS RECTIFIER FLYBACK CONVERTER

TECHNICAL FIELD

This application relates to switching power converters, and more particularly to the adaptive gate regulation of a synchronous rectifier switch transistor in a flyback converter.

BACKGROUND

As known in the flyback arts, a secondary-winding current in a flyback converter's transformer is rectified so as to not conduct while the primary-winding current conducts. This rectification may be performed by an output diode or by a synchronous rectifier switch transistor. Although an output diode is passive and thus requires no synchronous rectifier control, the use of an output diode lowers efficiency as compared to a flyback converter with synchronous rectification. Synchronous rectification is thus broadly used to improve efficiency.

The synchronous rectifier switch transistor is typically a metal-oxide-semiconductor field-effect transistor (MOSFET). To control the switching of a synchronous rectifier (SR) switch MOSFET, an SR controller monitors the drain-to-source voltage across the SR MOSFET. Based upon the drain-to-source voltage, the SR controller detects whether the power switch transistor has cycled off so that the SR switch transistor may be switched on. For example, if the SR switch transistor is an n-type metal-oxide semiconductor (NMOS) transistor, the SR controller switches on the SR switch transistor by increasing a gate-to-source voltage for the SR switch transistor above its threshold voltage.

Operation of the flyback converter in a continuous conduction mode (CCM) complicates the synchronous rectifier control. In CCM, the power switch transistor is switched on before the secondary winding current has ramped down to zero. In contrast, the secondary winding current has ramped down to zero before the power switch transistor is cycled on during a discontinuous conduction mode (DCM) of operation. During DCM operation, the SR controller may switch on the SR switch transistor when the SR MOSFET's drain-to-source voltage is less than a turn-on threshold voltage (e.g., −120 mV). The SR controller may then switch off the SR switch transistor when the drain-to-source voltage approaches a turn-off threshold voltage such as −3 mV. Since the SR switch transistor is then off, the power switch transistor may be cycled on without any danger of "shoot-through," which is the undesirable common-conduction condition of both the primary-winding current and the secondary-winding currents conducting at the same time.

But in CCM operation, the power switch transistor is cycled on while the SR switch transistor is still conducting. The drain-to-source voltage for the SR switch transistor quickly rises due to the power switch transistor being cycled on so that the drain-to-source voltage rises to the turn-off threshold voltage, whereupon the SR controller switches off the SR switch transistor. But a common-conduction condition exists from when the power switch transistor switches on to when the SR switch transistor switches off. Since the common-conduction issue during CCM operation is stressful to the power converter, it is conventional to apply a pre-drop technique to the gate voltage of the SR switch transistor to reduce the common-conduction time. In the pre-drop technique, the gate voltage of the SR switch transistor is pulled down to approximately the threshold voltage for the SR switch transistor. Since the gate-to-source voltage for the SR switch transistor is barely satisfying the threshold voltage, the SR controller can more quickly turn off the SR switch transistor in response to the drain-to-source voltage rising to the turn-off threshold voltage.

But how and when to pre-drop the gate voltage of the SR switch transistor remains a problem. If the gate voltage drops too fast and has an undershoot below the threshold voltage, the on-resistance for the SR switch transistor will suddenly become large. As a result, the drain voltage for the SR switch transistor drops, resulting in power loss increases. To reduce power losses, it is known to control the gate voltage of the SR switch transistor to regulate its drain voltage to a fixed, pre-set value. This regulation functions adequately during DCM operation and critical DCM operation. But during CCM operation, the drain voltage may not reach the desired pre-set value. To achieve regulation during CCM operation, the desired pre-set value may be lowered, but the resulting threshold for controlling the gate voltage sacrifices efficiency during CCM and DCM operation.

Accordingly, there is a need in the art for flyback converters with improved gate voltage control to increase power efficiency across both DCM and CCM operation.

SUMMARY

In accordance with a first aspect of the disclosure, a synchronous rectifier controller for a flyback converter is provided that includes: a differential amplifier configured to drive a gate voltage of a synchronous rectifier switch transistor during a regulated portion of a current cycle of the synchronous rectifier switch transistor, the differential amplifier being responsive to a difference between a drain voltage of the synchronous rectifier switch transistor and a dynamic drain threshold voltage; and a sample-and-hold circuit configured to sample and hold the drain voltage during the current cycle of the synchronous rectifier switch transistor to provide the dynamic drain threshold voltage, the sample-and-hold circuit being further configured to sample the drain voltage at a sampling time that is a function of a previous cycle of the synchronous rectifier switch transistor.

In accordance with a second aspect of the disclosure, a synchronous rectifier controller is provided that includes: a differential amplifier configured to drive a gate voltage of a synchronous rectifier switch transistor during a regulated portion of a current cycle of the synchronous rectifier switch transistor, the differential amplifier being responsive to a difference between a drain voltage of the synchronous rectifier switch transistor and a dynamic drain threshold voltage; and a timing analysis circuit configured to adjust the dynamic drain threshold voltage based upon a comparison of a duration of a regulated portion of a previous cycle of the synchronous rectifier switch transistor to a threshold delay.

In accordance with a third aspect of the disclosure, a method of controlling a gate voltage of a synchronous rectifier switch transistor is provided that includes: adapting a dynamic drain threshold voltage responsive to a previous cycle of the synchronous rectifier switch transistor; and during an on-time in a current cycle of the synchronous rectifier switch transistor, responding to a drain voltage of the synchronous rectifier switch transistor rising to equal the dynamic drain threshold voltage by controlling the gate voltage of the synchronous rectifier switch transistor to maintain the drain voltage of the synchronous rectifier switch transistor equal to the dynamic drain threshold voltage.

These and other aspects of the invention will become more fully understood upon a review of the detailed description, which follows. Other aspects, features, and embodiments will become apparent to those of ordinary skill in the art, upon reviewing the following description of specific, exemplary embodiments in conjunction with the accompanying figures. While features may be discussed relative to certain embodiments and figures below, all embodiments can include one or more of the advantageous features discussed herein. In other words, while one or more embodiments may be discussed as having certain advantageous features, one or more of such features may also be used in accordance with the various embodiments discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
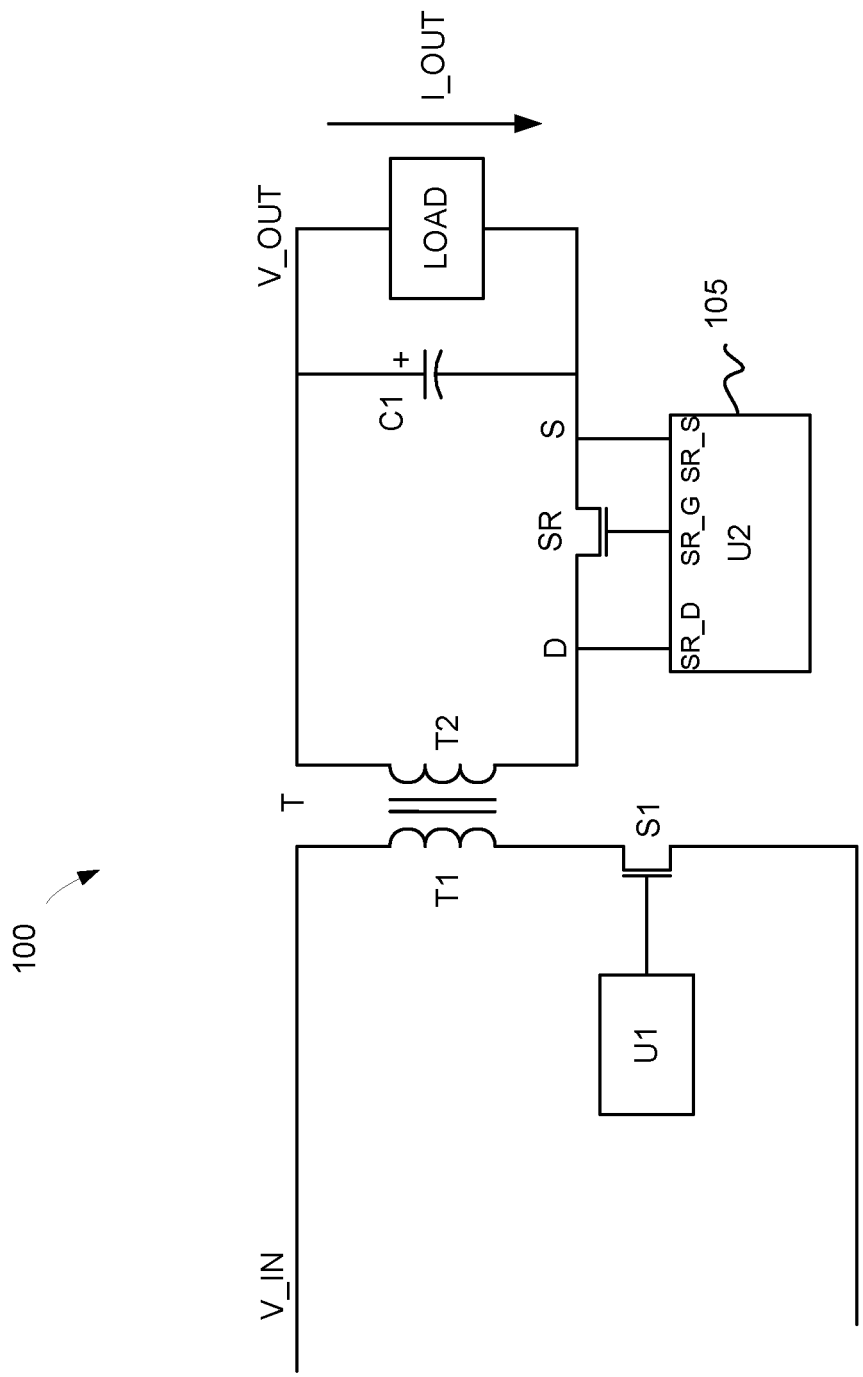
FIG. 1 illustrates a flyback converter including a secondary-side controller configured to regulate a drain voltage of the synchronous rectifier switch transistor to equal a dynamic drain threshold voltage during a regulated portion of the on-time of the synchronous rectifier switch transistor in accordance with an aspect of the disclosure.

Flyback converters are provided in which a secondary-side SR controller uses feedback to control the gate voltage of the SR switch transistor so that its drain voltage is regulated. Turning now to the drawings, an example flyback converter 100 with a gate-voltage regulating secondary-side SR controller (U2) 105 is shown in FIG. 1. Flyback converter 100 is powered by a rectified input voltage V_IN such as produced by a diode bridge (not illustrated) that rectifies an AC voltage from an AC mains. A primary-side controller U1 controls the cycling of a power switch transistor S1 to regulate an output voltage V_OUT supplied to a load. When the primary-side controller U1 switches on the power switch transistor S1, a primary-winding current conducts through a primary winding T1 of a transformer T. When a sense resistor voltage across a sense resistor (not illustrated) at the drain of power switch transistor S1 reaches a desired peak (Vipk), the primary-side controller U1 switches off the power switch transistor S1.

SR controller 105 detects whether the power switch transistor SW is on or off by monitoring a drain-to-source voltage Vds across an SR switch transistor. To perform this monitoring, SR controller 105 has a drain monitoring terminal SR_D and a source monitoring terminal SR_S. In addition, SR controller 105 includes a gate terminal SR_G that connects to a gate of the SR switch transistor to control whether the SR switch transistor is on or off. In response to detecting that the power switch transistor S1 is on, SR controller 105 maintains the SR switch transistor off to prevent a secondary-winding current from flowing in a secondary winding T2 of the transformer T. In response to detecting that the power switch transistor S1 is off, SR controller 105 switches on the SR switch transistor to let the secondary-winding current flow and charge an output capacitor C1 with the output voltage. Rather than monitor the drain-to-source voltage of the SR switch transistor to determine the switching state of the power switch transistor, SR controller 105 may instead receive a switch on or off status for the power switch transistor S1 through an isolating channel such as an optocoupler in alternative embodiments.

The problems of voltage pre-drop for both CCM and DCM operation are solved by adaptively regulating the drain voltage. With regard to this regulation, note that there are two conflicting issues that should be solved. For example, it would be optimal with regard to reducing the conduction losses (the Rds on-resistance) in the SR switch transistor to not regulate the drain voltage but instead drive the gate voltage of the SR switch transistor so that it was in saturation across the entire SR switch transistor on-time (the transformer reset time Trst). But with the gate voltage being relatively high, common-conduction losses (switch loss) will occur during CCM operation because it will then take longer to switch off the SR switch transistor in response to a switching-on of the power switch transistor. In contrast, if the drain voltage of the SR switch transistor were regulated by a feedback-controlled lowering of the gate voltage of the SR switch transistor, the common-conduction losses are reduced. It is thus advantageous to have the drain voltage unregulated during an initial portion of the SR switch transistor on-time and then regulated during a final portion of the SR switch transistor on-time. The regulated portion should not be too short, or the gate voltage is not reduced sufficiently at the end of the SR switch on-time, resulting in unacceptable common-conduction losses. Conversely, if the regulated portion is too long, the conduction losses may be unacceptable. There is thus an optimal duration for the regulation portion that achieves the desired goal of reducing common-conduction losses without causing unacceptable conduction losses.

The prior art, however, did not achieve a "just right" duration to the final regulated portion. For example, it is conventional to utilize a fixed drain threshold voltage that determined when the drain voltage regulation would begin. But the drain voltage behavior during the unregulated portion depends upon the load. In times of relatively high load such as to support a rapid charge modes, the flyback converter operates in CCM such that the drain voltage is more negative during the unregulated portion. Conversely, the flyback converter operates in DCM during periods of lower load such that the drain voltage is less negative during the unregulated portion. Since the drain voltage is less negative during DCM operation, the drain threshold voltage should be less negative as well or the regulated portion becomes too long. But such a relatively-larger value for the drain threshold voltage is then unsuitable for CCM operation since the drain voltage may then never rise to the drain threshold voltage to trigger the regulation of the drain voltage. In that case, the gate voltage would then be too high at the end of the SR switch transistor on-time so that common-conduction losses occur. The solution would then be to decrease the drain threshold voltage but then the regulation time becomes too long during DCM operation so that conduction losses occur.

To solve these issues, a dynamic drain threshold voltage is utilized that is adjusted responsive to the drain voltage regulation in a previous SR switch transistor cycle. As time goes on, each current SR switch transistor cycle becomes a previous SR switch transistor cycle to subsequent SR switch transistor cycles. The following discussion will assume that the dynamic drain threshold voltage is adjusted for a current SR switch transistor cycle based upon the regulation in the immediately-preceding SR switch transistor cycle but it will be appreciated that the historic SR switch transistor behavior may be averaged over several SR switch transistor cycles.

With regard to the drain voltage regulation in a preceding SR switch transistor on-time, several factors can be utilized to adjust the dynamic drain threshold voltage in the current SR switch transistor on-time. For example, the dynamic drain threshold voltage may be adjusted responsive to a duration of the preceding SR switch transistor on-time. If the current cycle is denoted by the integer n, the previous cycle's on-time may be denoted by the variable $Trst(n-1)$, where $Trst(i)$ is the SR switch transistor on-time in its ith cycle. Based upon this duration, the drain voltage is then sampled in the current cycle's on-time to form the dynamic drain threshold voltage for the current cycle. This sampling may be performed at a percentage of the SR switch on-time in the preceding SR switch transistor cycle that represents the desired division between the initial unregulated portion and the final regulated portion of the SR switch transistor on-time. Recall that this division should be such that the final regulated portion is neither too big nor too small. In one embodiment, the percentage of the SR switch transistor on-time occupied by the initial unregulated portion will be assumed to be greater than 50% such as 67.5%. The sampling time of the drain voltage in the current cycle would then occur after a delay of 67.5% of $Trst(n-1)$ has expired following the switching on of the SR switch transistor in the current cycle. But such a percentage is somewhat arbitrary and can be increased or decreased in alternative embodiments. For example, the percentage of the SR switch transistor on-time for the initial unregulated portion may be adjusted based upon operating conditions such as the switching frequency in alternative embodiments. Alternative, the sampling time may be a constant time c shorter than the preceding on-time such the sampling time would occur after a delay of $Trst(n-1)-c$ has expired following the switching on of the SR switch transistor in the current (the nth) cycle.

Figure 2:
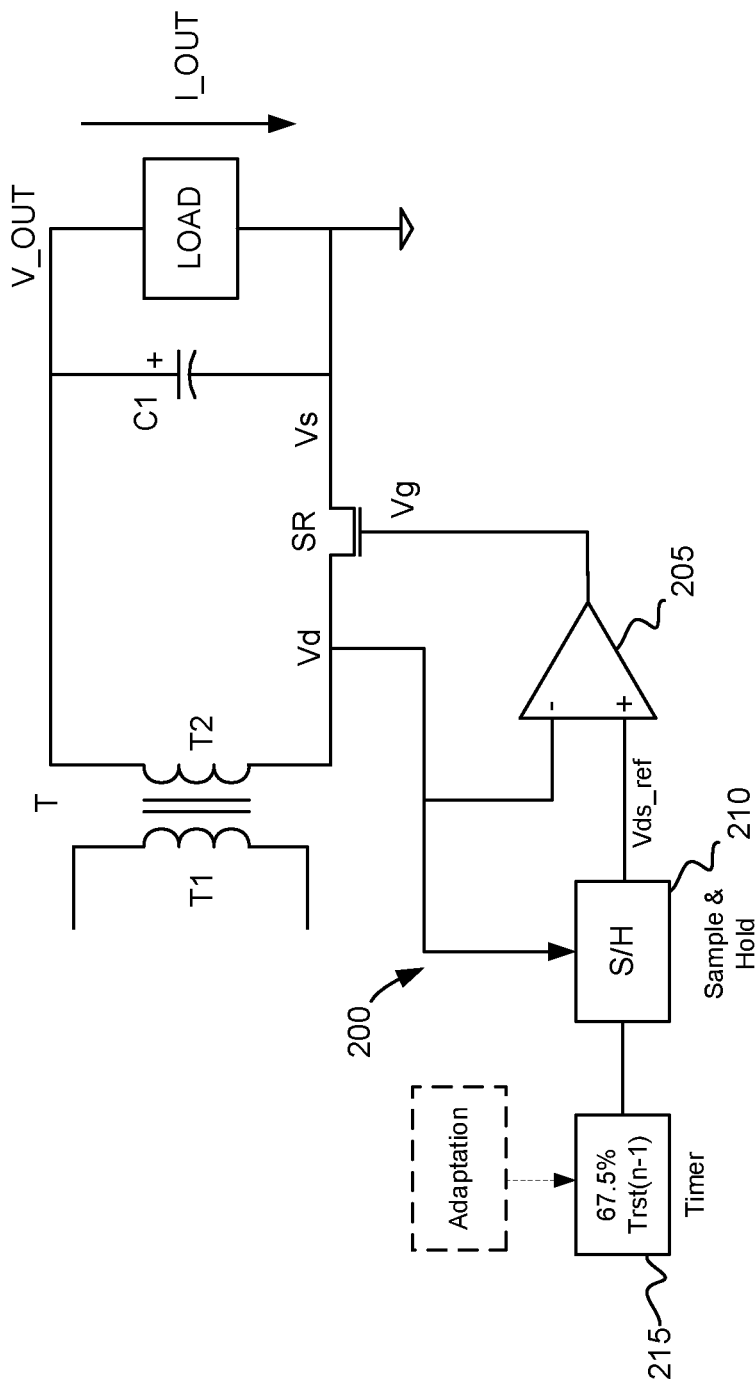
FIG. 2 illustrates an SR controller that samples the drain voltage at a percentage of the on-time for a previous cycle of the SR switch transistor to provide the dynamic drain threshold voltage in accordance with an aspect of the disclosure.

An SR controller 200 that adjusts the dynamic drain threshold voltage based upon SR switch transistor on-time $Trst(n-1)$ in a previous cycle of the SR switch transistor is shown in more detail in FIG. 2. A timer 215 times the desired delay as a function of $Trst(n-1)$. In this embodiment, the desired delay is 67.5% of $Trst(n-1)$ but other functions such as $Trst(n-1)-c$ as discussed previously may be used. A sample-and-hold (S/H) circuit 210 samples the drain voltage at the expiration of the delay timed by timer 215 to form a dynamic drain threshold voltage (Vds_ref) for the current switching cycle. A differential amplifier 205 begins regulating the gate voltage Vg of the SR switch transistor in its current cycle when the drain voltage rises during the SR switch transistor on-time to equal the dynamic drain threshold voltage (Vds_ref). Prior to this time, differential amplifier 205 functions as a gate driver so that the SR switch transistor was in saturation during the initial unregulated portion of the SR switch transistor on-time. But when the drain voltage rises to equal the dynamic drain threshold voltage, differential amplifier 205 functions to control the gate voltage so that the drain voltage is regulated to equal the dynamic drain threshold voltage during the final regulated portion of the SR switch transistor on-time.

Figure 3:
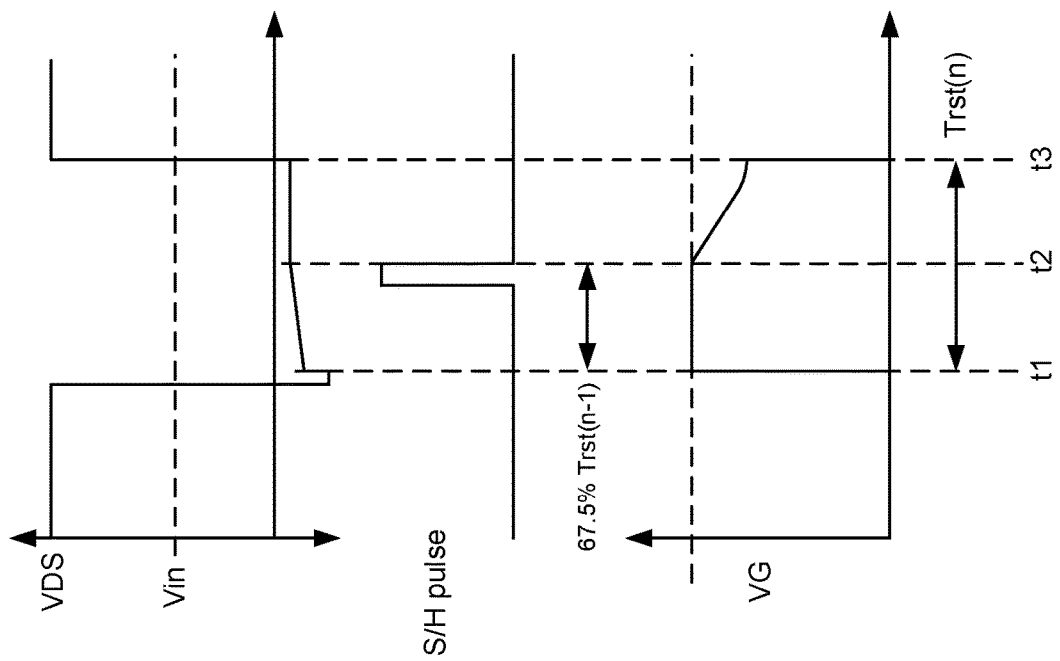
FIG. 3 illustrates some operating waveforms for the SR controller of FIG. 2 during normal operation (no sudden load transients).

Some operating waveforms for SR controller 200 in an embodiment that adjusts the dynamic drain threshold voltage based upon the SR switch transistor on-time $Trst(n-1)$ in a previous cycle of the SR switch transistor are shown in FIG. 3. The SR switch on-time in the current switching cycle begins at a time t1. The delay of 67.5% of $Trst(n-1)$ then expires at a time t2 such that the drain voltage VDS is sampled through a S/H pulse in the sample-and-hold circuit. The initial unregulated portion of the current SR switch transistor on-time thus extends from time t1 to time t2. The final regulated portion extends from time t2 to a time t3 when the SR switch transistor is cycled off. The dynamic drain threshold voltage equals the value of the drain voltage at the sampling time t2. During the final regulated portion, the drain voltage is regulated to equal the dynamic drain threshold voltage. The resulting gate voltage is thus relatively high during the initial unregulated portion as the gate driver is driving the SR switch transistor into saturation during that time. But during the final regulated portion, the gate voltage is continually reduced due to the drain voltage regulation. The final regulated portion will thus equal (100−67.5)% or 32.5% of the SR switch transistor on-time. This is quite advantageous in ensuring that the final regulated portion is neither too long nor too short in duration. In an alternative embodiment in which the sampling time is a fixed offset or constant value c from $Trst(n-1)$, the final regulated portion will have a constant duration c that is also advantageous in ensuring that the final regulated portion is neither too long nor too short in duration. To overcome any differential amplifier offset and sample-and-hold offset, a trimmable offset may be added (or subtracted) from the sampled drain voltage to form the dynamic drain threshold voltage. For example, the dynamic drain threshold voltage (Vds_ref) may equal the sampled drain voltage minus the trimmable offset. The trimmable offset may be set during a test mode of operation such as by burning fuses in a one-time-programmable memory.

Figure 4:
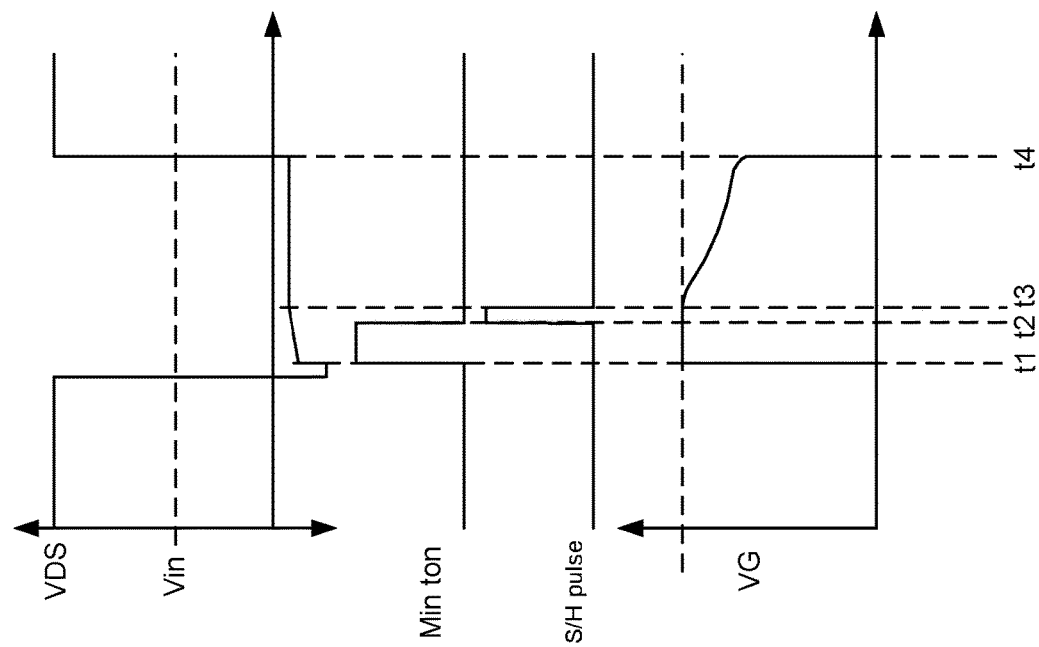
FIG. 4 illustrates some operating waveforms for the SR controller of FIG. 2 in response to a sudden load transient.

In the event of a sudden load change or input voltage change, the SR switch transistor on-time may vary significantly from one cycle to the next. It is thus possible that if the current switching cycle is significantly shorter than the previous one, basing the drain voltage regulation upon the previous cycle's on-time may result in the final regulated portion being unacceptable short or perhaps not even occur. For example, if the current cycle's SR switch transistor on-time is less than the function of $Trst(n-1)$ that is used to form the sampling time, then no drain voltage regulation would be triggered in the current switching cycle. Undesirable common-conduction losses and/or damage to the flyback converter may then occur. To avoid these problems, SR controller 200 may respond to the transient occurrence by using a minimum sampling time. Some example operating waveforms for such an occurrence are shown in FIG. 4. The SR switch transistor on-time begins at a time t1. At a time t2, the minimum sampling time (Min ton) expires with triggers a S/H pulse to sample the drain voltage at time t2. The drain voltage is then regulated to equal this sampled drain voltage during the final regulated portion from time t2 to a cycle-off time at a time t3. The gate voltage is thus adequately reduced at time t3 without the danger of excessive shoot through despite the transient load application.

Figure 5:
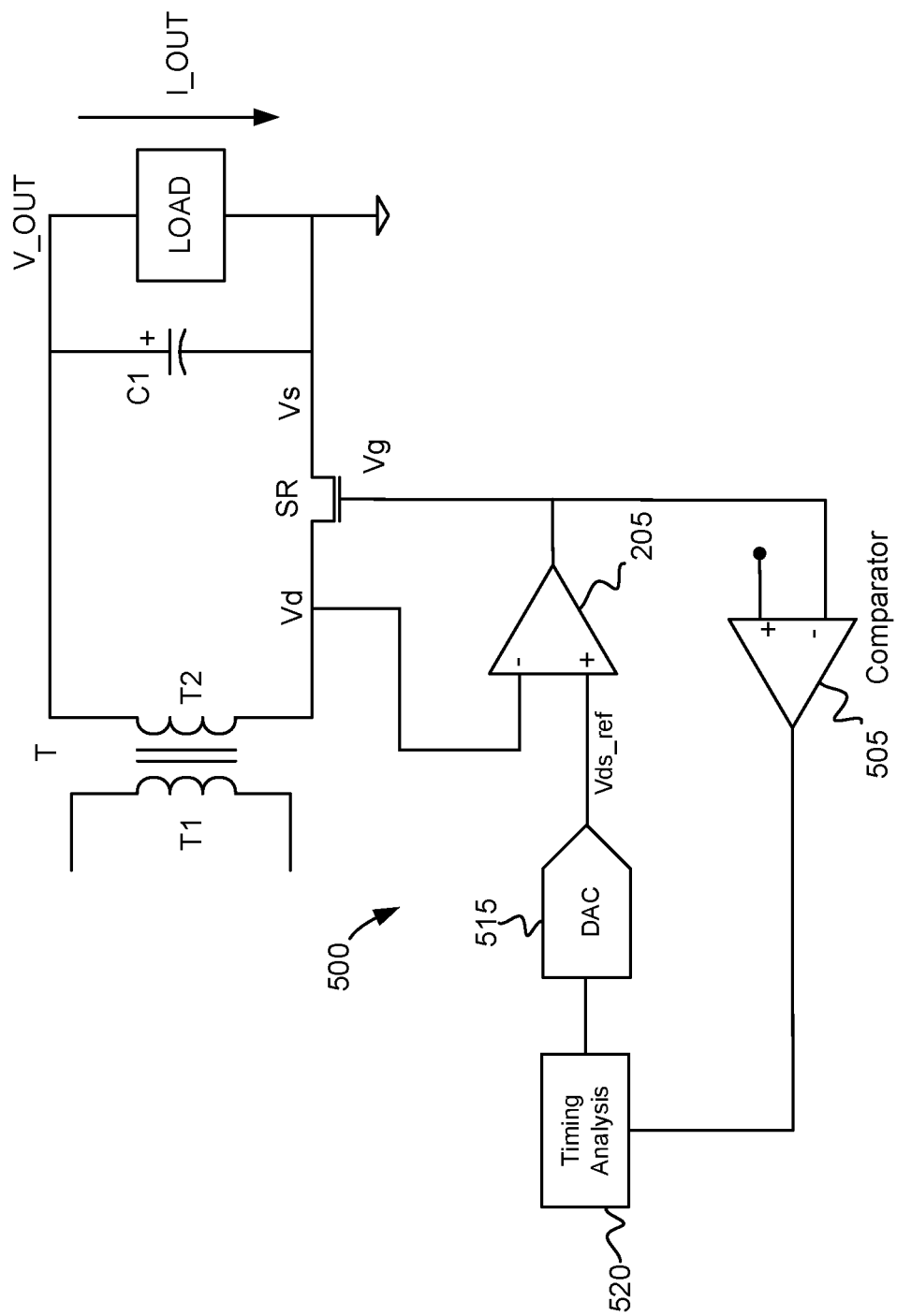
FIG. 5 illustrates an SR controller that compares a regulated portion of a previous cycle of the SR switch transistor to a threshold delay to adjust the dynamic drain threshold voltage in a current cycle of the SR switch transistor in accordance with an aspect of the disclosure.

Rather than use a function of the SR switch transistor on-time, the final regulated portion of the previous SR switching cycle may be measured and used to adjust the dynamic drain threshold voltage in the current switching cycle. An example SR controller 500 is shown in FIG. 5 in which a timing circuit (shown conceptually as a comparator) 505 compares the final regulated portion of the previous switching cycle to a threshold delay. If the final regulated portion is longer than the threshold delay, a timing analysis circuit 520 increases a digital value that is converted into the dynamic drain threshold voltage Vds_ref by a digital-to-analog converter (DAC) 515. Differential amplifier 205 functions as discussed with regard to SR controller 200 to regulate the drain voltage to equal the dynamic drain threshold voltage during the final regulated portion of the current switching cycle. Referring again to the drain voltage waveform of FIG. 3, it will be appreciated that increasing the dynamic drain threshold voltage shortens the final regulated portion for the current switching cycle. Conversely, timing analysis circuit 520 reduces the digital value and thus reduces the dynamic drain threshold voltage if the previous cycle's final regulated portion was too short. Such a reduction in the dynamic drain threshold voltage increases the duration of the final regulated portion for the current switching cycle. The feedback through differential amplifier 205 in SR controller 500 thus functions to regulate the final regulated portion to equal the threshold delay. This is quite advantageous in ensuring that the final regulated portion is neither too long nor too short to provide the desired reduction in both common-conduction losses and conduction losses.

Figure 6:
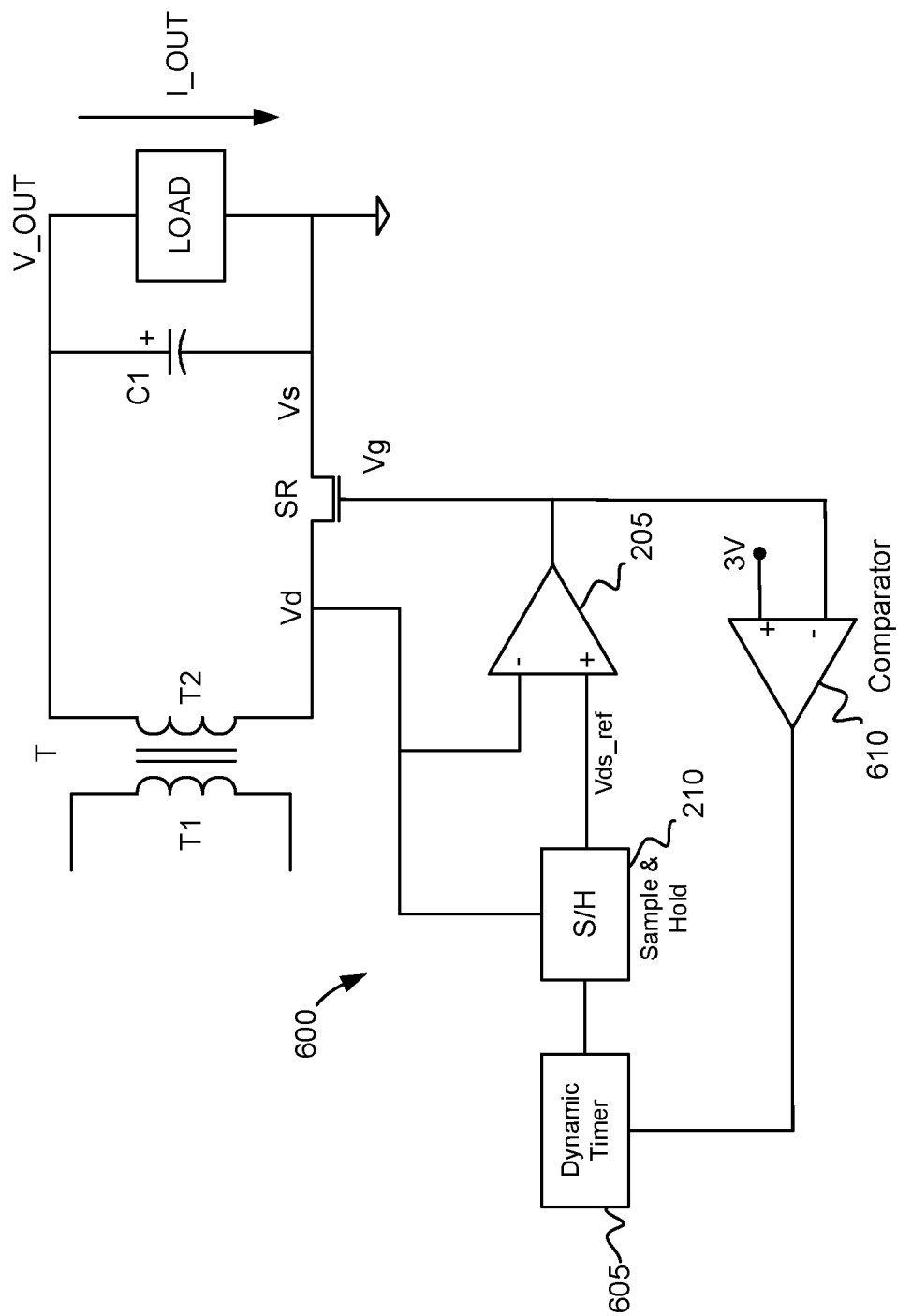
FIG. 6 illustrates an SR controller that samples the drain voltage at a sampling time during a current cycle based upon whether a comparison of a gate voltage during a previous cycle to a threshold gate voltage to provide the dynamic drain threshold voltage in accordance with an aspect of the disclosure.

In another embodiment, as shown for a SR controller 600 in FIG. 6, the gate voltage during each SR switch transistor on-time is compared to a threshold gate voltage value. The threshold value is chosen so that the resulting final regulated portion will have an appropriate duration. The following discussion will assume that the threshold gate voltage is 3 V but it will be appreciated that it may be higher or lower than this example threshold in alternative embodiments. A comparator 610 compares the gate voltage to the threshold gate voltage during each SR switch transistor on-time. The sampling time of the drain voltage is a dynamic value (Tsamp) as adjusted by a dynamic timer 605 based upon the comparison in comparator 610. If the comparison indicates that gate voltage decreased below the threshold gate voltage during the final regulated portion of the preceding switching cycle, the previous switching is deemed to have been a successful one such that dynamic timer 605 reduces the sampling time. Sample-and-hold circuit 210 functions as discussed with regard to SR controller 200 to sample the drain voltage at the adjusted sample time to obtain the dynamic drain threshold voltage. Similarly, differential amplifier 205 also functions as discussed with regard to SR controller 200 to regulate the drain voltage to equal the dynamic drain threshold voltage during the final regulated portion of the current SR switch transistor on-time. If the comparison by comparator 610 indicates that the gate voltage did not decrease below the gate threshold voltage during the previous switching cycle's SR switch transistor on-time, dynamic timer 605 decreases the sample time to provide a longer final regulation portion in the current SR switch transistor on-time. Referring again to FIG. 1, it will be appreciated that SR controller 105 is a generic representation of SR controllers 200, 500, and 600.

Figure 7:
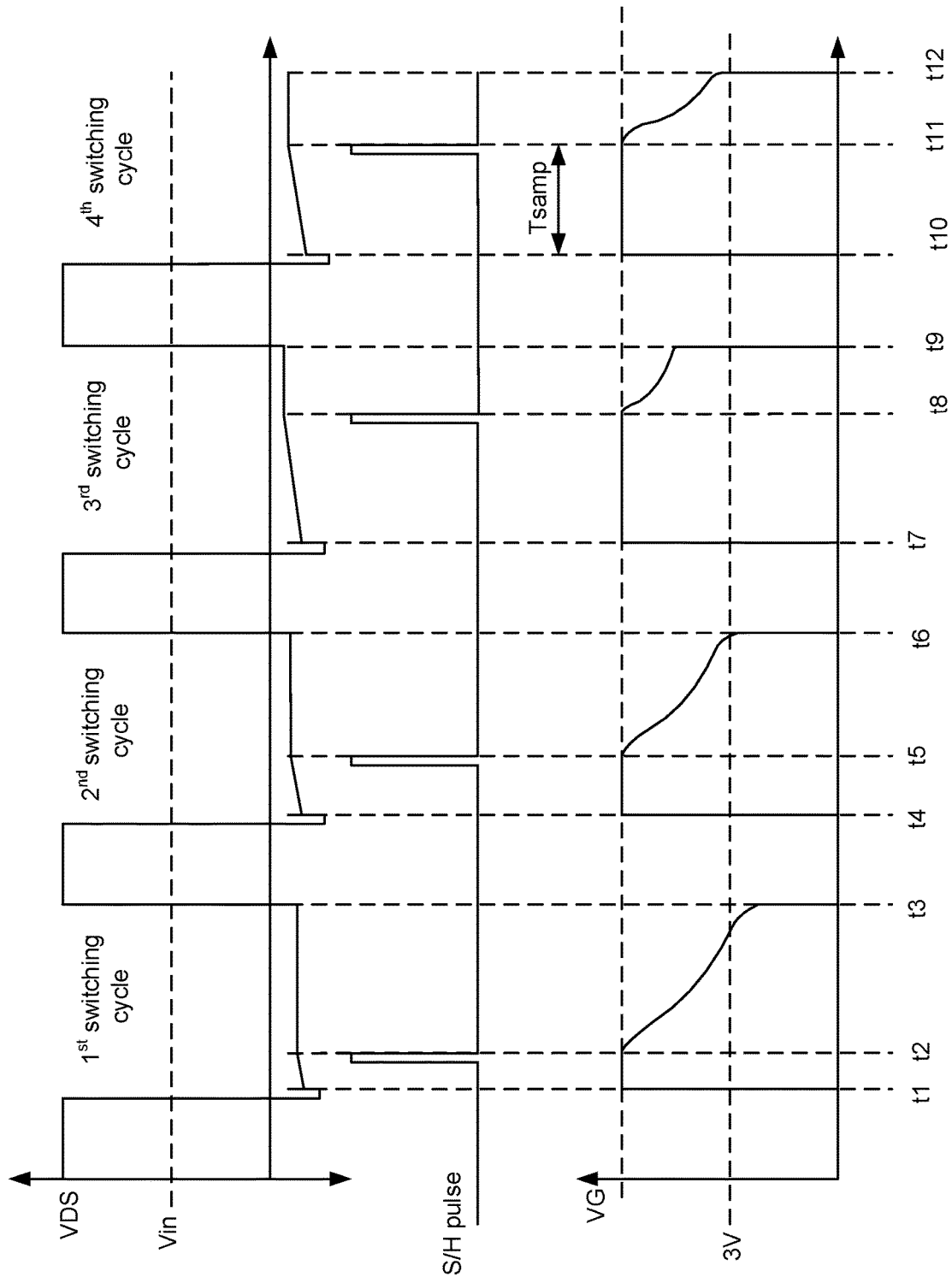
FIG. 7 illustrates some example waveforms for the SR controller of FIG. 6.

Some example operating waveforms for SR controller 600 are shown in FIG. 7. A first switching cycle begins with the SR switch transistor being switched on a time t1. The initial unregulated portion ends at a time t2 with a sampling S/H pulse for sampling the drain voltage. The drain voltage is then regulated at the sampled level for the final regulated portion extending from time t2 to a time t3 at which point the SR switch transistor on-time ends. The gate voltage remained above the desired level from time t2 to a time t3, so the sampling time is reduced for the subsequent switching cycle beginning at a time t4. The initial regulated portion for this second switching cycle extends from time t4 to a time t5. The final regulated portion extends from time t5 to a time t6. Comparing the first and second switching cycles, it may be seen that the delay between times t5 and t6 is reduced as compared to the delay between times t2 and t3. This is beneficial because the final regulated portion of the first switching cycle was undesirably too long, which could result in conduction losses. These losses are reduced in the second switching cycle.

A third switching cycle begins at a time t7 with an initial unregulated portion from time t7 to a time t8. The final regulated portion for the third switching cycle extends from time t8 to a time t9. But since the gate voltage did not decrease below the gate threshold voltage, the sampling time is reduced for a fourth switching cycle beginning at a time t10. The initial unregulated portion for the fourth switching cycle extends from time t10 to a time t11. The final regulated portion for the fourth switching cycle extends from time t11 to a time t12. Comparing the third and fourth switching cycles, it may be seen that the final regulated portion for the fourth switching cycle is increased as compared to the final regulated portion in the third switching cycle. This is advantageous in that the gate voltage did not decrease sufficiently during the final regulated portion of the third switching cycle, which could lead to common-conduction losses. But the gate voltage is more decreased in final regulated portion of the fourth switching cycle, thereby decreasing the likelihood of any common-conduction losses.

Those of some skill in this art will by now appreciate that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A synchronous rectifier controller for a flyback converter, comprising:
   a differential amplifier configured to drive a gate voltage of a synchronous rectifier switch transistor during a regulated portion of a current cycle of the synchronous rectifier switch transistor, the differential amplifier being responsive to a difference between a drain voltage of the synchronous rectifier switch transistor and a dynamic drain threshold voltage; and a sample-and-hold circuit configured to sample and hold the drain voltage during the current cycle of the synchronous rectifier switch transistor to provide the dynamic drain threshold voltage, the sample-and-hold circuit being further configured to sample the drain voltage at a sampling time that is a function of a previous cycle of the synchronous rectifier switch transistor.

2. The synchronous rectifier controller of claim 1, further comprising;

a timer configured to time an on-time of the synchronous rectifier switch transistor in the previous cycle, wherein the function of the previous cycle is a percentage of the on-time.

3. The synchronous rectifier controller of claim 1, further comprising:

a timer configured to time an on-time of the synchronous rectifier switch transistor in the previous cycle, wherein the function of the previous cycle is a difference between the on-time and a constant value.

4. The synchronous rectifier controller of claim 2, wherein the percentage is greater than 50%.

5. The synchronous rectifier controller of claim 1, further comprising:

a dynamic timer configured to adjust the sampling time responsive to whether the gate voltage of the synchronous rectifier switch transistor during the previous cycle was less than a threshold gate voltage, wherein the function of the previous cycle is a comparison of the gate voltage of the synchronous rectifier switch transistor was less than the threshold gate voltage.

6. The synchronous rectifier controller of claim 5, further comprising:

a comparator for comparing the gate voltage of the synchronous rectifier switch transistor to the threshold gate voltage, wherein the dynamic timer is configured to increase the sampling time if an output signal of the comparator indicates that the gate voltage of the synchronous rectifier switch transistor was less than the threshold gate voltage.

7. The synchronous rectifier controller of claim 6, wherein the dynamic timer is further configured to decrease the sampling time if an output signal of the comparator indicates that the gate voltage of the synchronous rectifier switch transistor was not less than the threshold gate voltage.

8. The synchronous rectifier controller of claim 7, wherein the threshold gate voltage is approximately 3 V.

9. A synchronous rectifier controller, comprising:

a differential amplifier configured to drive a gate voltage of a synchronous rectifier switch transistor during a regulated portion of a current cycle of the synchronous rectifier switch transistor, the differential amplifier being responsive to a difference between a drain voltage of the synchronous rectifier switch transistor and a dynamic drain threshold voltage; and a timing analysis circuit configured to adjust the dynamic drain threshold voltage based upon a comparison of a duration of a regulated portion of a previous cycle of the synchronous rectifier switch transistor to a threshold delay.

10. The synchronous rectifier controller of claim 9, further comprising:

a digital-to-analog converter for converting a digital value from the timing analysis circuit into the dynamic drain threshold voltage.

11. The synchronous rectifier controller of claim 9, wherein the timing analysis circuit is further configured to increase the dynamic drain threshold voltage in response to the duration of the regulated portion of the previous cycle of the synchronous rectifier switch transistor being greater than the threshold delay.

12. The synchronous rectifier controller of claim 11, wherein the timing analysis circuit is further configured to decrease the dynamic drain threshold voltage in response to the duration of the regulated portion of the previous cycle of the synchronous rectifier switch transistor being less than the threshold delay.

13. The synchronous rectifier controller of claim 12, wherein the threshold delay is a constant.

14. The synchronous rectifier controller of claim 12, wherein the threshold delay is a variable delay.

15. A method of controlling a gate voltage of a synchronous rectifier switch transistor, comprising:

adapting a dynamic drain threshold voltage responsive to a previous cycle of the synchronous rectifier switch transistor; and during an on-time in a current cycle of the synchronous rectifier switch transistor, responding to a drain voltage of the synchronous rectifier switch transistor rising to equal the dynamic drain threshold voltage by controlling the gate voltage of the synchronous rectifier switch transistor to maintain the drain voltage of the synchronous rectifier switch transistor equal to the dynamic drain threshold voltage.

16. The method of claim 15, further comprising:

measuring an on-time of the synchronous rectifier switch transistor during the previous cycle of the synchronous rectifier switch transistor to provide a measured on-time; and during the on-time in the current cycle of the synchronous rectifier switch transistor, sampling the drain voltage of the synchronous rectifier switch transistor at a percentage of the measured on-time to provide the dynamic drain threshold voltage.

17. The method of claim 15, further comprising:

measuring an on-time of the synchronous rectifier switch transistor during the previous cycle of the synchronous rectifier switch transistor to provide a measured on-time; and during the on-time in the current cycle of the synchronous rectifier switch transistor, sampling the drain voltage of the synchronous rectifier switch transistor at a sampling time equaling a difference of the measured on-time and a constant value to provide the dynamic drain threshold voltage.

18. The method of claim 15, further comprising:

timing a regulated portion of an on-time of the synchronous rectifier switch transistor during the previous cycle of the synchronous rectifier switch transistor to provide a measured regulated portion;

adjusting a sampling time based upon a difference between the measured regulated portion and a threshold delay to provide an adjusted sampling time; and during the on-time in the current cycle of the synchronous rectifier switch transistor, sampling the drain voltage of the synchronous rectifier switch transistor at the adjusted sampling time to provide the dynamic drain threshold voltage.

19. The method of claim 15, further comprising:
adjusting a sampling time based upon a comparison of the gate voltage of the synchronous rectifier switch transistor during an on-time of the synchronous rectifier switch transistor during the previous cycle of the synchronous rectifier switch transistor to a threshold gate voltage to provide an adjusted sampling time; and
during the on-time in the current cycle of the synchronous rectifier switch transistor, sampling the drain voltage of the synchronous rectifier switch transistor at the adjusted sampling time to provide the dynamic drain threshold voltage.

\* \* \* \* \*